(12) United States Patent
Egi et al.

(10) Patent No.: US 12,147,211 B2
(45) Date of Patent: Nov. 19, 2024

(54) CONTROL DEVICE

(71) Applicant: OMRON Corporation, Kyoto (JP)

(72) Inventors: Mamoru Egi, Kyoto (JP); Takumi Fujioka, Kyoto (JP); Sota Kaida, Kyoto (JP); Hiroyuki Harada, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 163 days.

(21) Appl. No.: 17/908,108

(22) PCT Filed: Dec. 16, 2020

(86) PCT No.: PCT/JP2020/046863
§ 371 (c)(1),
(2) Date: Aug. 30, 2022

(87) PCT Pub. No.: WO2021/181787
PCT Pub. Date: Sep. 16, 2021

(65) Prior Publication Data
US 2023/0084056 A1 Mar. 16, 2023

(30) Foreign Application Priority Data
Mar. 12, 2020 (JP) .................. 2020-042820

(51) Int. Cl.
*G05B 19/05* (2006.01)
*G01R 23/02* (2006.01)

(52) U.S. Cl.
CPC ............. *G05B 19/05* (2013.01); *G01R 23/02* (2013.01); *G05B 2219/1185* (2013.01)

(58) Field of Classification Search
CPC ....................... G05B 19/05; G05B 2219/1185; G01R 23/02; G01R 31/2837; G01R 31/2829
See application file for complete search history.

(56) References Cited

U.S. PATENT DOCUMENTS 6,198,246 B1   3/2001   Yutkowitz
10,025,296 B2 * 7/2018   Iijima .................. G05B 19/416
(Continued)

FOREIGN PATENT DOCUMENTS

JP   2005214711 A   8/2005
JP   2006195543 A   7/2006
(Continued)

OTHER PUBLICATIONS

International Search Report issued in Intl. Appln. No. PCT/JP2020/046863 mailed Mar. 9, 2021. English translation provided.
(Continued)

*Primary Examiner* — Bickey Dhakal
(74) *Attorney, Agent, or Firm* — ROSSI, KIMMS & MCDOWELL LLP

(57) ABSTRACT

A measurement device measures a frequency response of a servo system, applies predetermined oscillation are associated with each other to the servo system, identifies, from a result of oscillation application, a pair of a first oscillation application signal and a first response signal, and identifies a pair of a second oscillation application signal and a second response signal. Then, a first frequency response that is a frequency response is calculated on the basis of the first oscillation application signal and the first response signal, a second frequency response that is a frequency response is calculated on the basis of the second oscillation application signal and the second response signal, and the first frequency response and the second frequency response are synthesized.

11 Claims, 22 Drawing Sheets

(56) References Cited

U.S. PATENT DOCUMENTS

| | | | |
|---|---|---|---|
| 2007/0268068 A1* | 11/2007 | Yutkowitz | G05B 13/042 |
| | | | 329/325 |
| 2016/0123796 A1 | 5/2016 | Nagaoka et al. | |
| 2017/0063268 A1* | 3/2017 | da Silva | G05B 13/02 |
| 2018/0159545 A1* | 6/2018 | Eke | H02P 7/04 |

FOREIGN PATENT DOCUMENTS

| | | | | |
|---|---|---|---|---|
| JP | 2009122779 A | * | 6/2009 | |
| JP | 2016010287 A | | 1/2016 | |
| WO | 2014196003 A1 | | 12/2014 | |
| WO | WO-2018163664 A1 | * | 9/2018 | H02P 21/09 |

OTHER PUBLICATIONS

Written Opinion issued in Intl. Appln. No. PCT/JP2020/046863 mailed Mar. 9, 2021. English translation provided.

* cited by examiner

Oscillation application signal and response signal (section 1)

Frequency response (section 1)

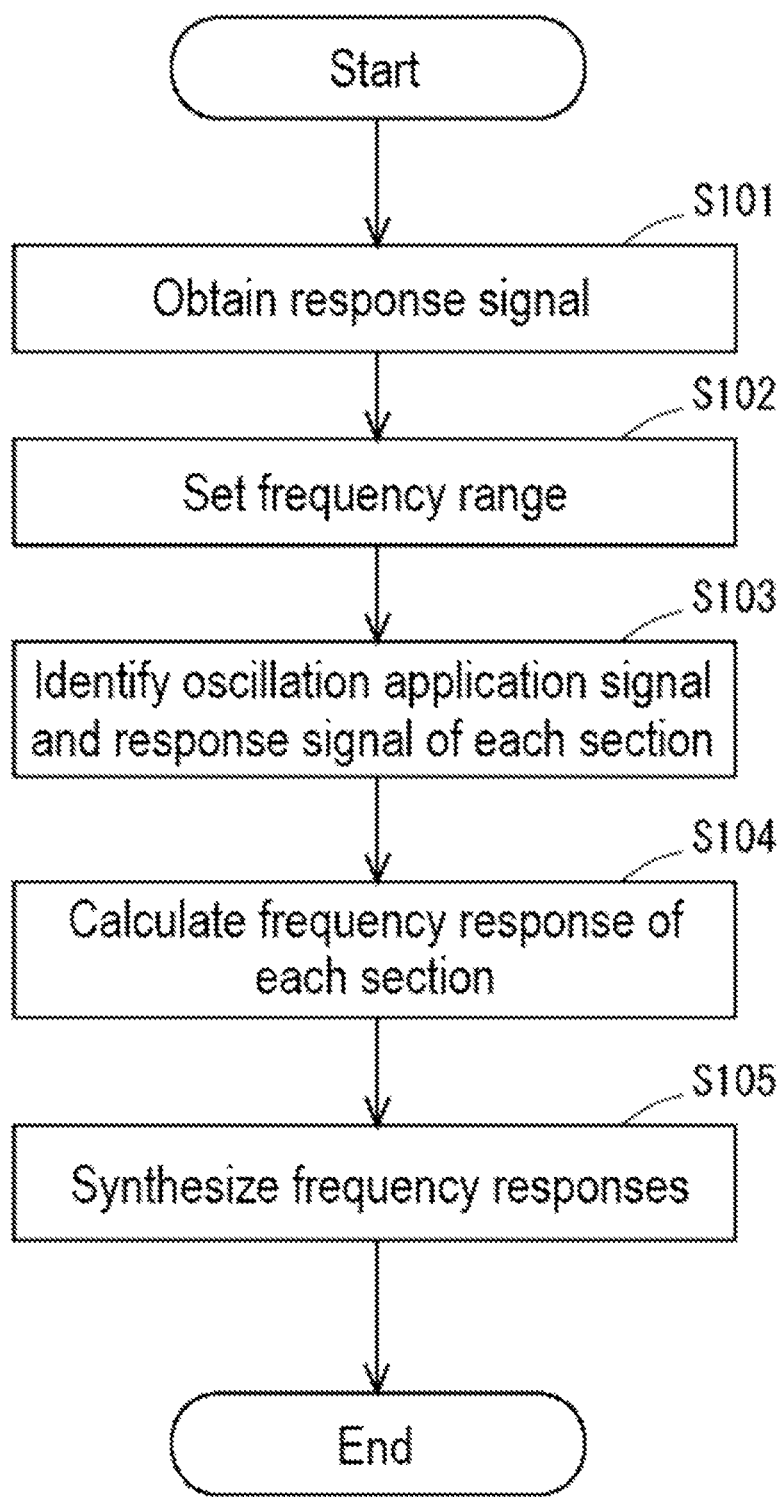

< Example of invention >

< Average processing performed >

CONTROL DEVICE

TECHNICAL FIELD

The invention relates to a measurement device that measures a frequency response of a servo system that performs servo control of a load.

BACKGROUND ART

In order to construct a servo system that performs servo control of a load, a frequency response of the servo system may be measured. In general, gain adjustment of a control loop such as a speed loop and a position loop of the servo system is performed in consideration of the measured frequency response. For example, in a technique disclosed in Patent Document 1, a frequency response is calculated for each oscillation application cycle by using a response signal obtained by adding, to the servo system, an oscillation application signal having a reference cycle of a plurality of different pseudo random signals as an oscillation application cycle, and the frequency responses are synthesized to obtain a final frequency response of the servo system. As a result, it is possible to obtain a frequency response while suppressing an influence of disturbance such as friction.

In order to accurately identify a frequency response, a method of dividing a frequency band and identifying a response characteristic for each divided band is known. For example, in a partial iteration method, a method of limiting the number of modes included in each band of the divided frequency band and identifying a transfer function in each band is known. In a mode circle fitting method, a method of dividing the frequency band such that only one mode exists in the band and identifying a quadratic transfer function for each divided band is known.

PRIOR ART DOCUMENT

Patent Documents

Patent Document 1: Japanese Unexamined Patent Publication No. 2016-10287

Patent Document 2: Japanese Unexamined Patent Publication No. 2006-195543

SUMMARY OF THE INVENTION

Problems to be Solved by the Invention

When a frequency response of a servo system connected to a load is measured, oscillation including a frequency component in a range to be measured is generally applied to the servo system, and the frequency response is measured on the basis of a response signal and an oscillation application signal of the servo system at that time. Here, when oscillation at a resonance frequency is applied to the servo system, a peak appears in the response signal. However, even when oscillation at a frequency other than the resonance frequency is applied, the resonance frequency may be excited in the response signal. As a result, in the frequency response of the servo system, a gain of the resonance frequency appears to be larger than a proper value, and there is a possibility that suitable use of the frequency response is hindered.

There are various factors that cause such excitation of an unnecessary resonance frequency when oscillation is applied to the servo system. In particular, an influence of an anti-resonance frequency in the servo system connected to the load is considered to be large. That is, when an oscillation application signal including a resonance frequency is added to the servo system, a response to an input of the anti-resonance frequency may be measured as a response to an input of the resonance frequency in calculation of a frequency response, and as a result, it is difficult to accurately measure the frequency response.

The invention has been made in view of such a problem, and an object of the invention is to provide a technique for accurately measuring a frequency response of a servo system connected to a load.

Means for Solving the Problem

In the invention, in order to solve the above problem, when a frequency response of a servo system is measured, the frequency response of the servo system is obtained by dividing a frequency range to be measured into a range including a resonance frequency of the servo system and a range including an anti-resonance frequency, calculating each frequency response, and synthesizing results of the calculation. This configuration can exclude an influence of excitation of an unnecessary resonance frequency due to oscillation applied at an anti-resonance frequency.

Specifically, the invention is a measurement device configured to measure a frequency response of a servo system, the measurement device including an oscillation executor configured to apply, to the servo system, predetermined oscillation in which an oscillation application time and an excitation frequency are associated with each other, an identifier configured to identify, from a result of oscillation applied by the oscillation executor, a pair of a first oscillation application signal corresponding to a first range that is a frequency range including a resonance frequency of the servo system and not including an anti-resonance frequency of the servo system and a first response signal temporally corresponding to the first oscillation application signal, and further identify a pair of a second oscillation application signal corresponding to a second range that is a frequency range lower than the first range and includes the anti-resonance frequency and a second response signal temporally corresponding to the second oscillation application signal, a calculator configured to calculate a first frequency response that is a frequency response corresponding to the first range based on the first oscillation application signal and the first response signal, and calculate a second frequency response that is a frequency response corresponding to the second range based on the second oscillation application signal and the second response signal, and a synthesizer configured to synthesize frequency responses in frequency ranges corresponding to the first range and the second range based on the first frequency response and the second frequency response.

In the predetermined oscillation applied by the oscillation executor of the measurement device, the oscillation application time and the excitation frequency are associated with each other. This means that the oscillation is applied by the oscillation executor in a mode in which the oscillation application time during which the oscillation of a certain excitation frequency is applied can be identified. An example of the predetermined oscillation is a so-called Sweptsine signal.

Then, from a result obtained by the oscillation applied to the servo system by the oscillation executor, the identifier identifies a pair of an oscillation application signal and a response signal corresponding to the first range and a pair of an oscillation application signal and a response signal corresponding to the second range. The oscillation application signal is a signal related to the oscillation applied to the servo system, and the response signal is a signal output from the servo system by the applied oscillation. Here, the first range is a frequency range that includes the resonance frequency of the servo system but does not include the anti-resonance frequency, and the second range is a frequency range that includes the anti-resonance frequency. That is, the frequency range of the first range and the frequency range of the second range are set so as not to include both the resonance frequency and the anti-resonance frequency. As described above, the association between the oscillation application time and the excitation frequency in a predetermined signal allows the identifier to identify the pair of the oscillation application signal and the response signal.

Then, when the identifier identifies the pair of the oscillation application signal and the response signal corresponding to the first range and the pair of the oscillation application signal and the response signal corresponding to the second range, the calculator calculates the frequency response corresponding to the first range and the frequency response corresponding to the second range by using the respective pairs. Here, the anti-resonance frequency and the resonance frequency belong to different ranges, and the oscillation application signals and the response signals temporally correspond to each other. Therefore, even if the resonance frequency is excited by the oscillation of the anti-resonance frequency in the actual servo system, the influence of the excitation is excluded, and the frequency response in the frequency range corresponding to each of the first range and the second range is calculated. Then, the synthesizer synthesizes the frequency responses corresponding to the respective frequency ranges calculated by the calculator to generate frequency responses corresponding to both the frequency ranges.

As described above, in the measurement device disclosed in the application, the influence of the excitation of the unnecessary resonance frequency caused by the oscillation applied at the anti-resonance frequency during the oscillation applied to the servo system can be excluded, and the frequency response of the servo system connected to a load can be accurately measured.

Here, in the measurement device, the identifier may further identify a pair of a third oscillation application signal corresponding to a third range that is a remaining frequency range of the predetermined oscillation excluding the first range and the second range and a third response signal temporally corresponding to the third oscillation application signal from a result of the oscillation applied by the oscillation executor. Then, the calculator may further calculate a third frequency response that is a frequency response corresponding to the third range based on the third oscillation application signal and the third response signal, and the synthesizer may synthesize frequency responses in an entire frequency range included in the predetermined oscillation based on the first frequency response, the second frequency response, and the third frequency response. This configuration makes it possible to accurately measure the frequency response of the servo system in the entire frequency range included in the predetermined oscillation including the third range.

Here, two modes of application of the predetermined oscillation by the oscillation executor will be exemplified. In a first mode, the oscillation executor may apply oscillation in a frequency range including the first range and the second range to the servo system as one of the predetermined oscillation. In this case, the identifier may identify an oscillation signal corresponding to the first range in the predetermined oscillation as the first oscillation application signal, and identify a response signal corresponding to an oscillation application time of the first oscillation application signal in a response signal of the servo system as the first response signal, and the identifier may further identify an oscillation signal corresponding to the second range in the predetermined oscillation as the second oscillation application signal, and identify a response signal corresponding to an oscillation application time of the second oscillation application signal in the response signal of the servo system as the second response signal.

That is, in the first mode, the oscillation executor collectively applies the predetermined oscillation to the servo system as one oscillation. Thus, the response signal of the servo system as a direct result of the application of the predetermined oscillation includes excitation of the resonance frequency (excitation of the unnecessary resonance frequency) caused by the oscillation applied at the anti-resonance frequency. However, the identifier identifies the pair of the first oscillation application signal and the first response signal and the pair of the second oscillation application signal and the second response signal in consideration of the frequency range and the temporal correspondence between the oscillation application signal and the response signal as described above, and therefore, the influence of the excitation of the unnecessary resonance frequency caused by the oscillation applied at the anti-resonance frequency can be excluded when the calculator calculates the frequency response.

Next, in a second mode, the oscillation executor may apply oscillation in the first range to the servo system as a first oscillation that is one of the predetermined oscillation, and may apply oscillation in the second range to the servo system as a second oscillation that is another one of the predetermined oscillation. In this case, the identifier may identify an oscillation signal of the first oscillation as the first oscillation application signal and identify a response signal of the servo system when the first oscillation is applied as the first response signal, and the identifier may further identify an oscillation signal of the second oscillation as the second oscillation application signal, and identify a response signal of the servo system when the second oscillation is applied as the second response signal.

That is, in the second mode, the oscillation executor applies the predetermined oscillation to the servo system after dividing the predetermined oscillation into the first oscillation and the second oscillation. Thus, the pair of the oscillation application signal and the response signal related to the first oscillation and the pair of the oscillation application signal and the response signal related to the second oscillation are temporally separated. Therefore, the identifier identifies the pair of the first oscillation application signal and the first response signal and the pair of the second oscillation application signal and the second response signal as described above, and therefore, the influence of the excitation of the unnecessary resonance frequency caused by the oscillation applied at the anti-resonance frequency can be excluded in a subsequent process of calculation of the frequency responses corresponding to the first range and the second range by the calculator.

In the measurement device described above, the servo system may be configured to perform servo control of a motor connected to a predetermined load. In this case, for example, the first range and the second range may be set based on a ratio of an inertia moment of the predetermined load to an inertia moment of the motor. That is, since the anti-resonance frequency can be physically estimated based on the ratio of the inertia moment of the predetermined load to the inertia moment of the motor, the first range and the second range can be set based on a result of the estimation.

Here, in the measurement device described above, when the resonance frequency of the servo system is known, filter processing by a notch filter may be performed in order to suppress oscillation due to an increase in gain of the servo system. The notch filter can be defined by a center frequency (that is, a frequency near the resonance frequency) to be a center of the filter processing and a Q value representing a spread of a frequency range that is influenced by an effect of the filter processing. In such a case, the following modes can be exemplified for the setting of the first range and the second range. First, the first range and the second range may be set based on the center frequency and the Q value of the notch filter. Alternatively, the first range and the second range may be set based on the center frequency of the notch filter and a gain in the frequency response. Still alternatively, the first range and the second range may be set based on the center frequency of the notch filter, and a width of the first range and a width of the second range may be set to be smaller than a predetermined upper limit width. These modes may be appropriately selected in consideration of mechanical characteristics and control characteristics of the servo system, and the first range and the second range may be set in accordance with other modes.

As for the setting of the first range and the second range, the widths of the first range and the second range may be set to be identical regardless of whether the notch filter is used, and alternatively, the width of the second range may be set to be larger than the width of the first range.

In the measurement device described above, the synthesizer may perform predetermined average processing on the frequency responses having been synthesized. That is, the synthesizer performs the predetermined average processing as post-processing after synthesis. Since the first frequency response and the second frequency response are calculated after the frequency range is divided into the first range and the second range as described above, discontinuity of the frequency response may occur at a boundary of the ranges when the frequency ranges are synthesized. Such discontinuity can be eliminated by performing the predetermined average processing. Examples of the predetermined average processing include moving average processing.

Effect of the Invention

A technique for accurately measuring a frequency response of a servo system connected to a load can be provided.

BRIEF DESCRIPTION OF THE DRAWINGS

FIG. 8 is a first flowchart illustrating a flow of the measurement processing of the frequency response by the measurement device.

MODE FOR CARRYING OUT THE INVENTION

Application Example

Figure 1:
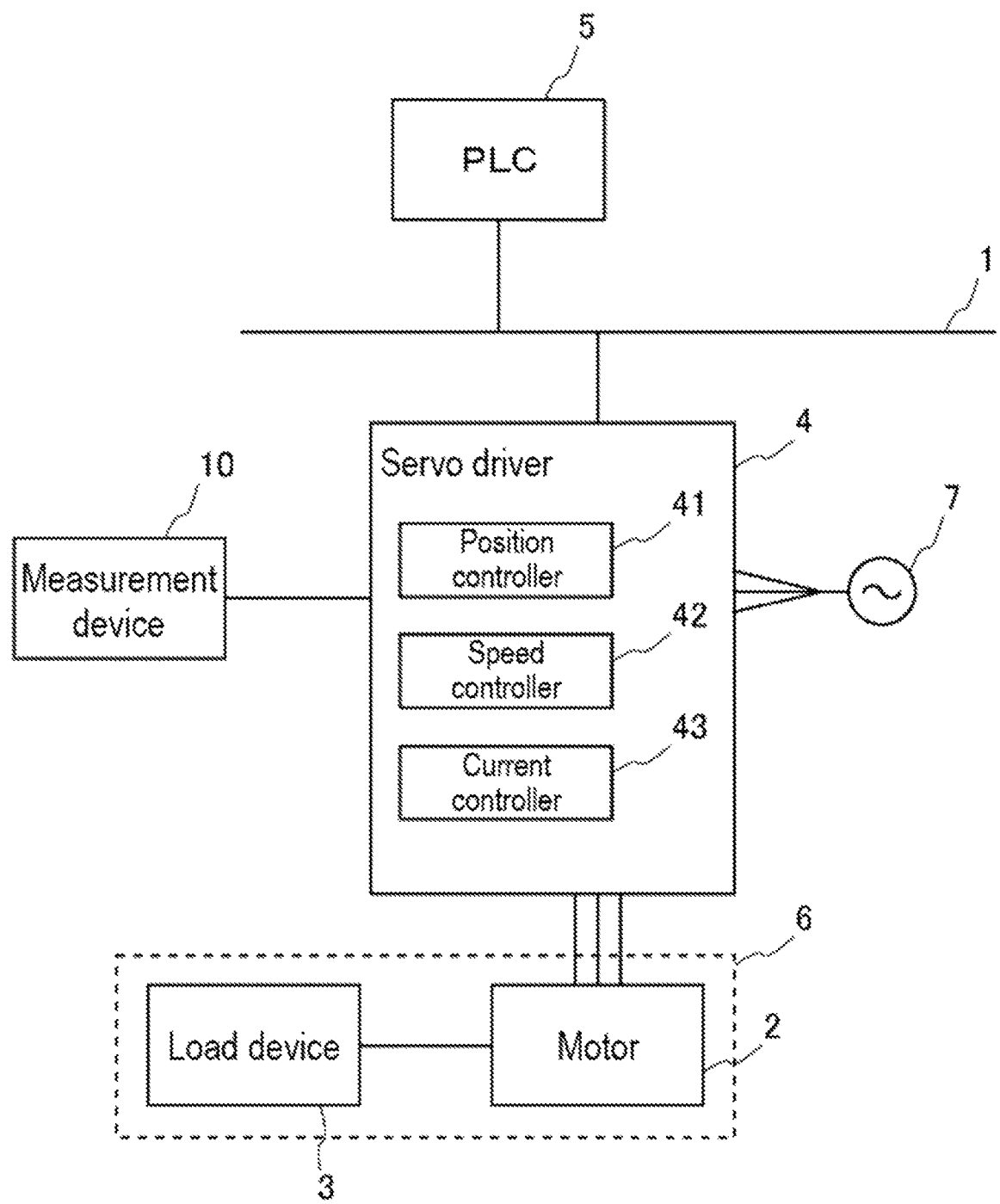
FIG. 1 is a diagram illustrating a schematic configuration of a system including a servo system in which a frequency response is measured by a measurement device.

An application example of a measurement device of the application will be described below with reference to the drawings. FIG. 1 is a diagram illustrating a schematic configuration of a control system including a servo system in which a frequency response is measured by a measurement device 10. A control system includes a network 1, a motor 2, a load device 3, a servo driver 4, and a programmable logic controller (PLC) 5. The control system is a system for driving and controlling the load device 3 together with the motor 2. The motor 2 and the load device 3 are a control target 6 controlled by the control system. Here, various mechanical devices (for example, an arm of an industrial robot or a conveyance device) can be exemplified as the load device 3, and the motor 2 is incorporated in the load device 3 as an actuator for driving the load device 3. For example, the motor 2 is an AC servomotor. An encoder (not shown) is attached to the motor 2, and a parameter signal related to motion of the motor 2 is fed back to the servo driver 4 by the encoder. The parameter signal (hereinafter, referred to as a feedback signal) to be fed back includes, for example, position information on a rotational position (angle) of a rotation shaft of the motor 2, information on a rotational speed of the rotation shaft, and the like.

The servo driver 4 receives a motion command signal related to the motion of the motor 2 from the PLC 5 via the network 1, and receives the feedback signal output from the encoder connected to the motor 2. The servo driver 4 calculates servo control related to the drive of the motor 2, that is, a command value related to the motion of the motor 2 on the basis of the motion command signal from the PLC 5 and the feedback signal from the encoder, and supplies a drive current to the motor 2 such that the motion of the motor 2 follows the command value. As a supply current, AC power transmitted from an AC power supply 7 to the servo driver 4 is used. In this example, the servo driver 4 is of a type that receives three-phase alternating current, but may be of a type that receives single-phase alternating current. In the servo driver 4, a servo system that performs feedback control using a position controller 41, a speed controller 42, and a current controller 43 (see FIG. 2) included in the servo driver 4 is formed.

Figure 2:
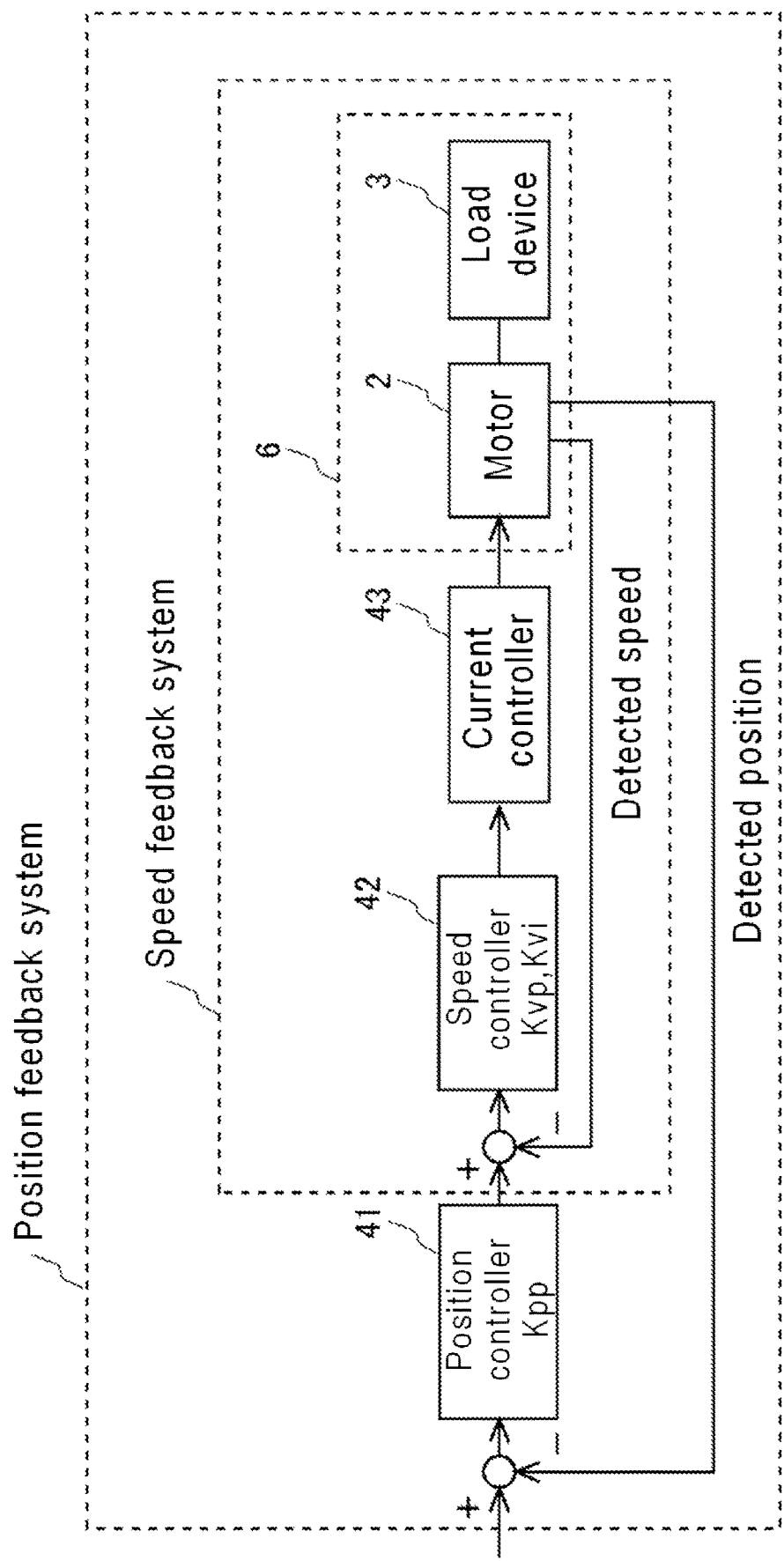
FIG. 2 is a diagram for describing the servo system.

As illustrated in FIG. 2, the servo driver 4 includes the position controller 41, the speed controller 42, and the current controller 43. The servo system in the servo driver 4 will be described with reference to FIG. 2. The position controller 41 performs, for example, proportional control (P control). Specifically, a speed command is calculated by multiplying a position deviation, which is a deviation between the position command and a detected position notified from the PLC 5, by a position proportional gain Kpp. The position controller 41 has the position proportional gain Kpp as a control parameter in advance.

Next, the speed controller 42 performs, for example, proportional integration control (PI control). Specifically, a torque command is calculated by multiplying an integral amount of the speed deviation, which is a deviation between the speed command calculated by the position controller 41 and a detected speed, by a speed integration gain Kvi, and multiplying the sum of the calculation result and the speed deviation by a speed proportional gain Kvp. The speed controller 42 has the speed integration gain Kvi and the speed proportional gain Kvp as control parameters in advance. The speed controller 42 may perform the P control instead of the PI control. In this case, the speed controller 42 has the speed proportional gain Kvp as a control parameter in advance. Next, the current controller 43 outputs a current command on the basis of the torque command calculated by the speed controller 42, and thus the motor 2 is driven and controlled. The current controller 43 includes a filter (first-order low-pass filter) related to the torque command and one or a plurality of notch filters, and has a cutoff frequency, a center frequency, and the like related to performance of these filters as control parameters.

A control structure of the servo driver 4 includes a speed feedback system having the speed controller 42, the current controller 43, and the control target 6 as forward elements, and further includes a position feedback system having the speed feedback system and the position controller 41 as forward elements. The control structure configured as described above enables the servo driver 4 to perform servo control of the motor 2 to follow the position command fed from the PLC 5.

Here, in FIG. 1, the measurement device 10 is electrically connected to the servo driver 4. The electrical connection may be a wired connection or a wireless connection. In order to set and adjust the control parameters of the servo driver 4, the measurement device 10 is equipped with software (program) for measuring the frequency response of the servo system. Specifically, the measurement device 10 is a computer having an arithmetic device, a memory, and the like, and executable measurement software is installed in the computer. Then, the measurement device 10 measures the frequency response of the servo system by the measurement software.

Figure 3:
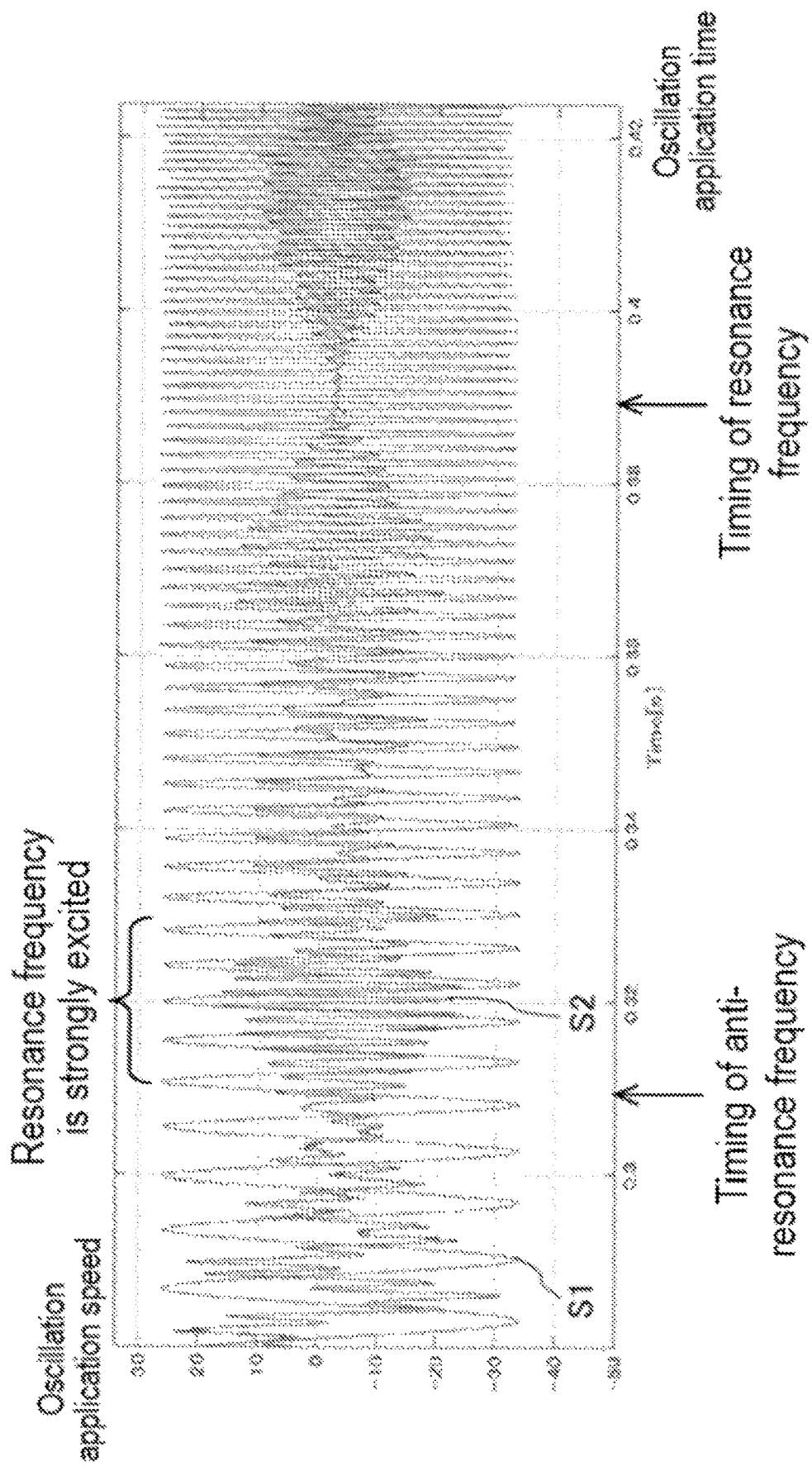
FIG. 3 is a first diagram illustrating excitation of a resonance frequency due to excitation at an anti-resonance frequency, which occurs when the frequency response is measured.

Here, a problem in measuring the frequency response of the servo system will be described with reference to FIGS. 3 and 4. FIG. 3 illustrates a transition of a detected speed when speed oscillation is applied to the servo system. In FIG. 3, S1 represents the speed oscillation, and S2 represents the detected speed. The speed oscillation is an oscillation signal of so-called Sweptsine, and oscillation application time and an excitation frequency are associated with each other. The resonance frequency of the servo system is 617 Hz, and the oscillation application time is 0.39 s. The anti-resonance frequency of the servo system is 200 Hz, and the oscillation application time is 0.31 s. For this servo system, a notch filter is provided in the current controller 43, and a center frequency of the notch filter is set to the resonance frequency.

Figure 4A:
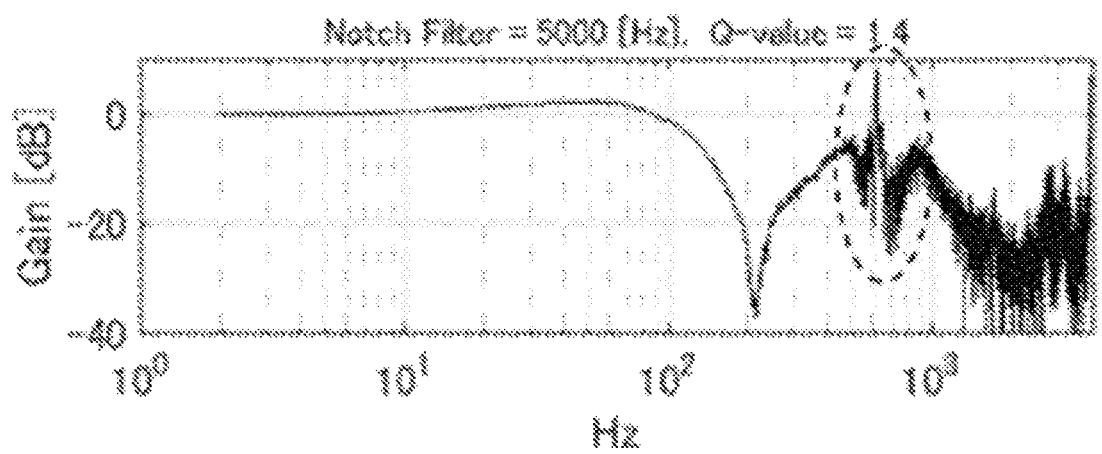
FIGS. 4A and 4B are second diagrams illustrating excitation of the resonance frequency due to excitation at the anti-resonance frequency, which occurs when the frequency response is measured.
Figure 4B:
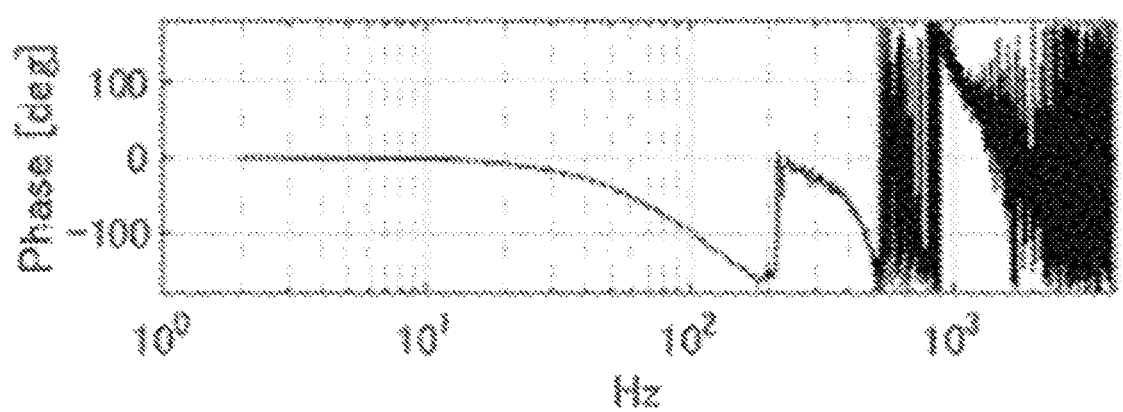

As can be seen from FIG. 3, the oscillation of the resonance frequency is excited in the detected speed at a timing when the oscillation of the anti-resonance frequency is applied. On the other hand, at a timing when the oscillation of the resonance frequency is applied, large oscillation cannot be found in the detected speed due to an effect of the notch filter. Then, FIG. 4 illustrates, as a Bode plot, a frequency response calculated by fast Fourier transformation (FFT) processing with S1 as an oscillation application signal and S2 as a response signal. FIG. 4A is a magnitude plot, and FIG. 4B is a phase plot. As can be seen from the magnitude plot, a peak with a large gain can be found near the resonance frequency (region surrounded by a broken line). This reflects not a resonance corresponding to the oscillation applied at the resonance frequency but the excitation of the resonance frequency caused by the oscillation applied at the anti-resonance frequency. However, viewing only the Bode plot in FIG. 4 will give an illusion that a resonance is simply generated, and make the effect of the set notch filter suspicious.

When the frequency response is calculated by the conventional FFT processing in this manner, it is difficult to accurately measure the frequency response of the servo system due to an influence of the excitation of the unnecessary resonance frequency caused by the oscillation applied at the anti-resonance frequency to the servo system. Therefore, setting an appropriate control parameter for the servo system can be inhibited.

Figure 5:
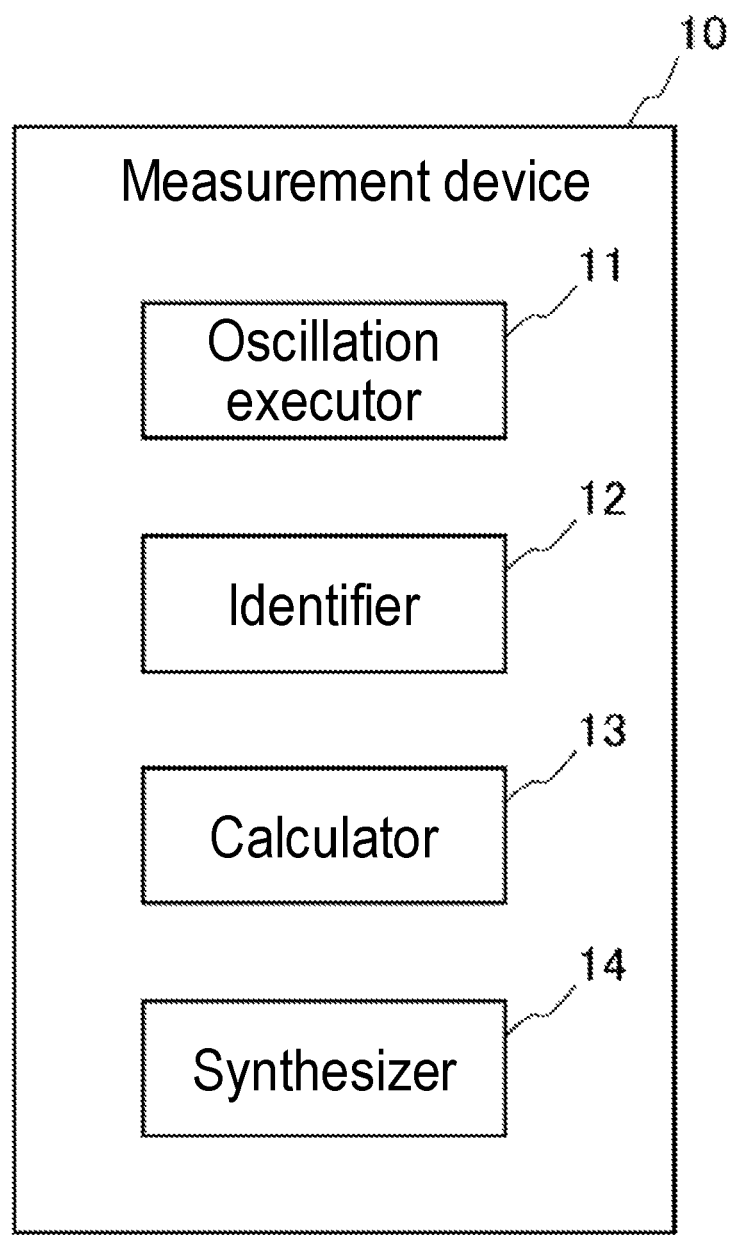
FIG. 5 is a diagram of a functional unit of the measurement device.
Figure 6:
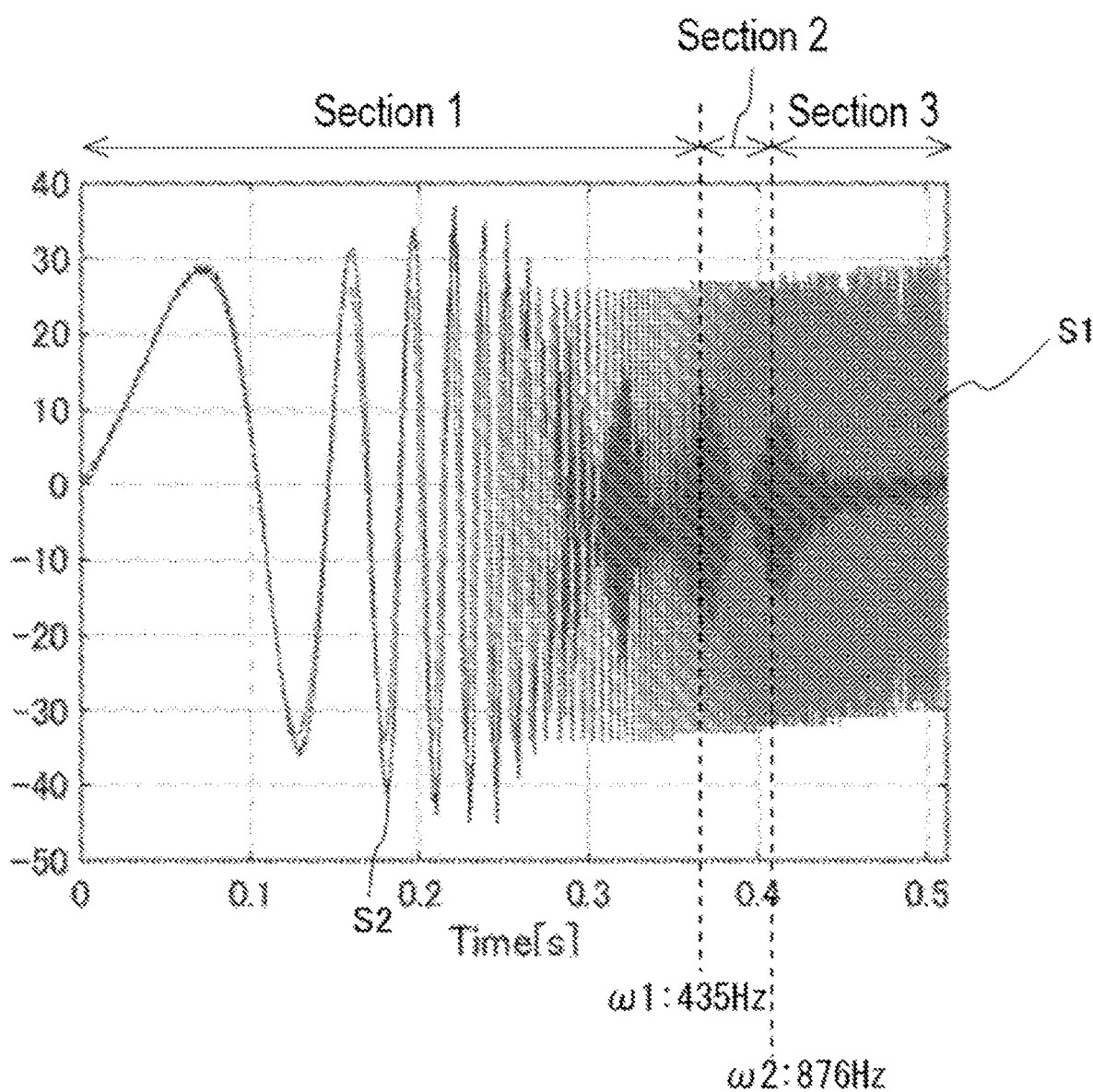
FIG. 6 is a diagram for describing setting of a frequency range in measurement processing of the frequency response.

In consideration of the above problem, the measurement device 10 disclosed in the application is configured as illustrated in FIG. 5. FIG. 5 is a functional block diagram representing various functions executed by software executed in the measurement device 10. The measurement device 10 includes an oscillation executor 11, an identifier 12, a calculator 13, and a synthesizer 14. An operation of each functional unit will be described with reference to FIGS. 6 and 7. FIG. 6 illustrates a time response signal S2 of the servo system when the oscillation application signal S1 of Sweptsine over an entire frequency range that needs to be measured is applied to the servo system. FIG. 7 is a diagram for describing the operation of the calculator 13 and the synthesizer 14.

The oscillation executor 11 is configured to apply a predetermined oscillation in which the oscillation application time and the excitation frequency are associated with each other to the servo system. In an example illustrated in FIG. 6, the oscillation executor 11 applies the oscillation application signal S1, which is Sweptsine over the entire frequency range, to the servo system. Then, the oscillation executor 11 applies oscillation to obtain the time response signal S2 of the servo system consequently, and the identifier 12 is configured to identify a pair of the oscillation application signal and the response signal corresponding to a plurality of frequency ranges from the result. Here, setting of the plurality of frequency ranges will be described with reference to FIG. 6. First, a frequency range including the resonance frequency (617 Hz) of the servo system (corresponding to a first range of the application) is defined as a section 2. A lower limit boundary value ω1 of the section 2 is 435 Hz, an upper limit boundary value ω2 is 876 Hz, and the anti-resonance frequency (200 Hz) of the servo system is not included in the section 2. A frequency range lower than the section 2 (corresponding to the second range of the application) is defined as a section 1. The section 1 includes the anti-resonance frequency (200 Hz) of the servo system. A frequency range higher than the section 2 (corresponding to a third range of the application) is defined as a section 3. The section 3 does not include the anti-resonance frequency (200 Hz) and the resonance frequency (617 Hz) of the servo system. Details of setting of each frequency range will be described later.

Then, corresponding to each section, the identifier 12 identifies a pair of the oscillation application signal and the response signal temporally corresponding to the oscillation application signal. For example, since the frequency range is less than 435 Hz in the section 1, the pair of the oscillation application signal from a start of the oscillation application to a timing at which the oscillation application frequency increases to 435 Hz in the oscillation of Sweptsine and the time response signal from the start of the oscillation application to the timing is identified as the pair of the oscillation application signal and the response signal corresponding to the section 1 (which corresponds to the pair of the second oscillation application signal and the second response signal of the application). Similarly, in the section 2, a pair of the oscillation application signal until the oscillation application frequency increases from 435 Hz to 876 Hz in the oscillation of Sweptsine and the time response signal temporally corresponding to the oscillation application signal is identified as the pair of the oscillation application signal and the response signal corresponding to the section 2 (which corresponds to the pair of the first oscillation application signal and the first response signal of the application). In the section 3, a pair of the oscillation application signal when the oscillation application frequency is 876 Hz until an end of the oscillation application in the oscillation of Sweptsine and the time response signal temporally corresponding to the oscillation application signal is identified as the pair of the oscillation application signal and the response signal corresponding to the section 3 (which corresponds to the pair of the third oscillation application signal and the third response signal of the application).

Next, the calculator 13 will be described. The calculator 13 is configured to calculate the frequency response corresponding to each section using the FFT processing on the basis of the pair of the oscillation application signal and the response signal corresponding to each section. Here, as for the FFT processing, the FFT processing is performed by overwriting data of the response signal in the section other than the section to be calculated with "0" and then using the oscillation application signal S1 as an input and the overwritten response signal as an output. Then, data corresponding to the frequency range of the section to be calculated is extracted from a result of the FFT processing, and the extracted data is calculated as the frequency response of the section to be calculated. For example, when the frequency response corresponding to the section 1 is calculated, data corresponding to the section 2 and the section 3 of the response signal S2 is overwritten with "0", and the FFT processing is performed using the oscillation application signal S1 as an input and the overwritten response signal S2 as an output. Furthermore, from a result of the FFT processing, the frequency response corresponding to the frequency range of less than 435 Hz, which is the frequency range of the section 1, is calculated as the frequency response corresponding to the section 1. The same applies to the calculation of the frequency response corresponding to the section 2 and the section 3.

Figure 7A:
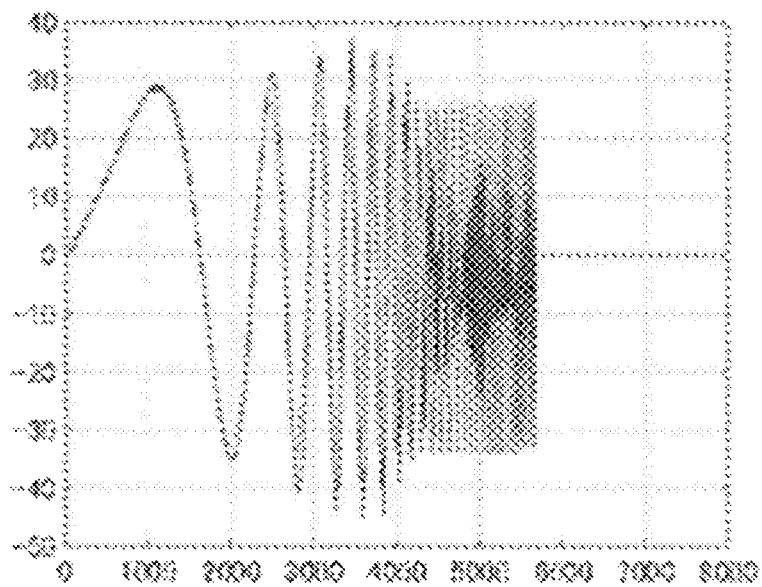
FIGS. 7A, 7B, 7C, 7D, 7E and 7F are diagrams for describing calculation and synthesis of the frequency response in the measurement processing of the frequency response.
Figure 7B:
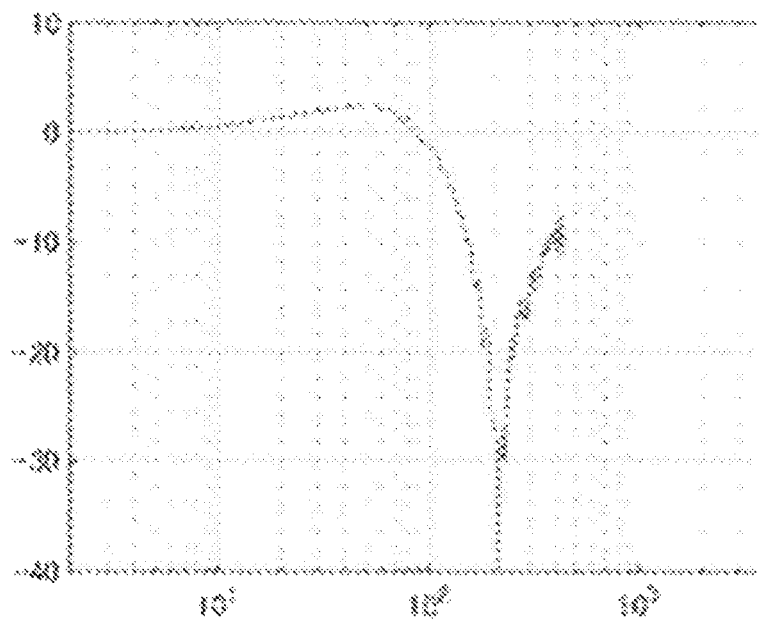
Figure 7C:
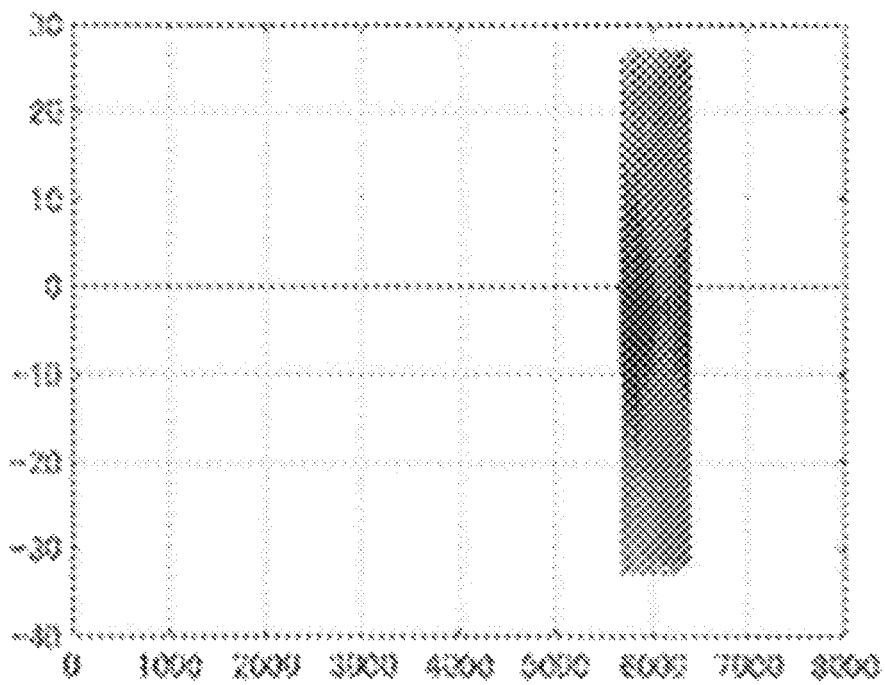
Figure 7D:
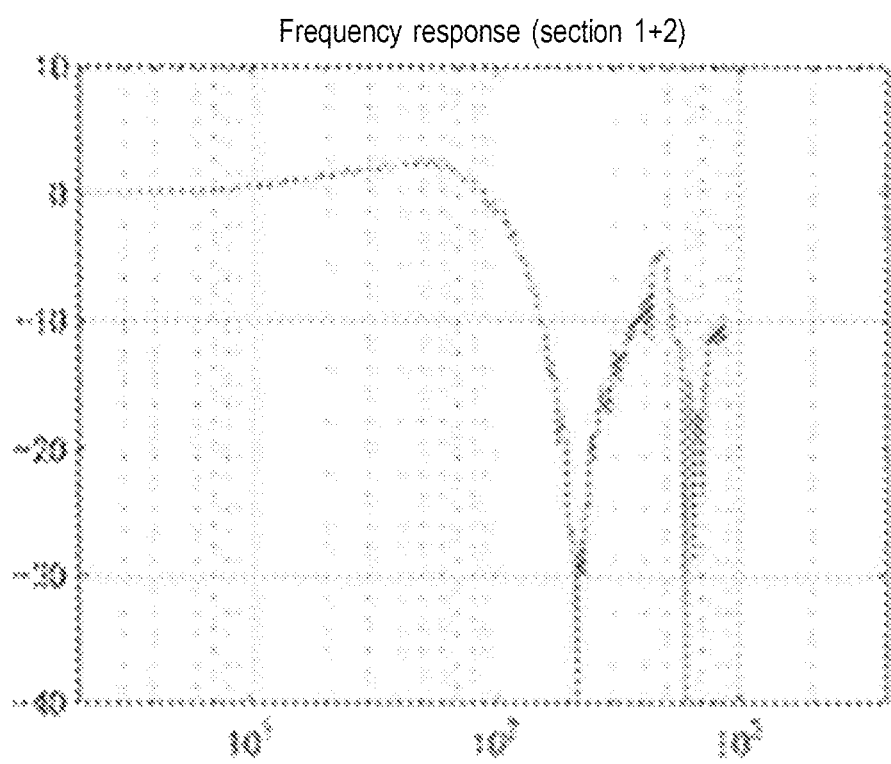
Figure 7E:
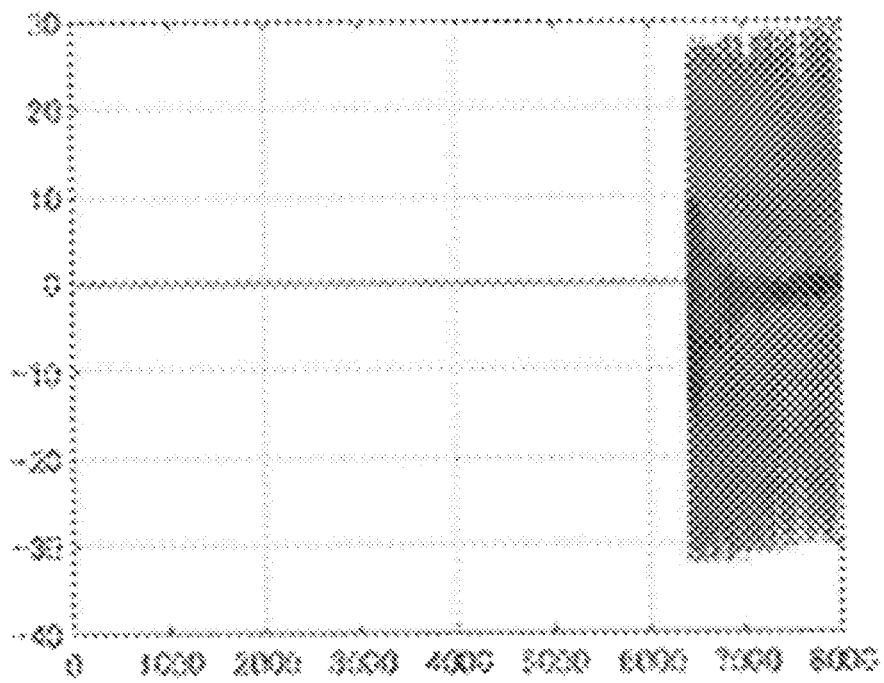
Figure 7F:
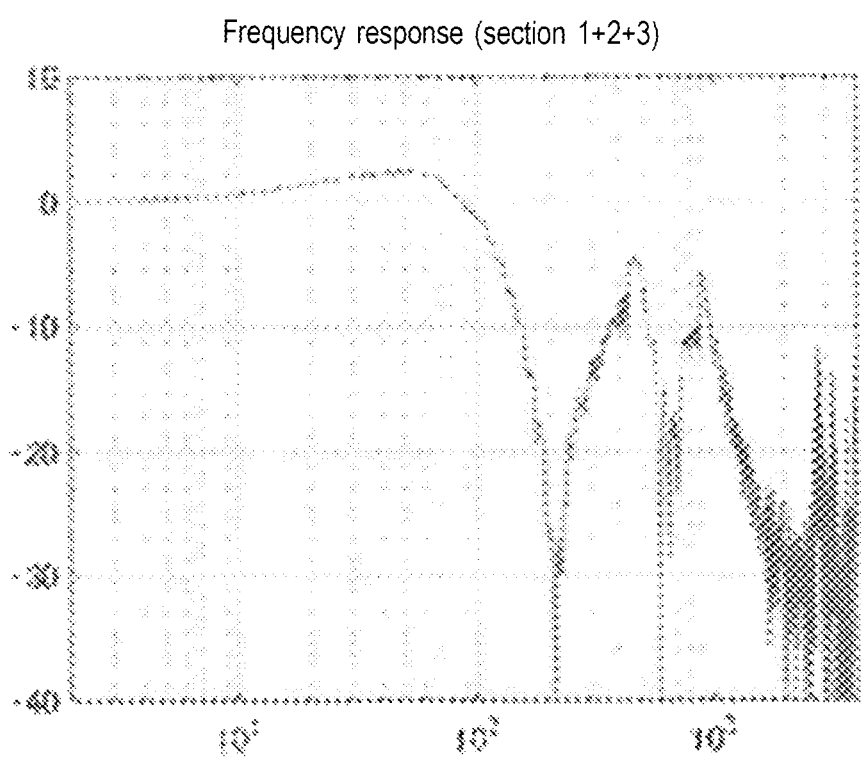

Next, the synthesizer 14 will be described. The synthesizer 14 is configured to generate the frequency response of the servo system by synthesizing and gathering the frequency responses corresponding to the respective sections calculated by the calculator 13. A specific synthesis mode of the frequency response will be described with reference to FIG. 7. FIGS. 7A and 7B illustrate the oscillation application signal and the response signal (FIG. 7A) corresponding to the section 1, and the frequency response corresponding to the section 1 calculated by the oscillation application signal and the response signal. FIGS. 7C and 7D illustrate a state in which the oscillation application signal and the response signal (FIG. 7C) corresponding to the section 2 and the frequency response corresponding to the section 2 calculated from the oscillation application signal and the response signal are synthesized with the frequency response corresponding to the section 1 illustrated in FIG. 7B. In calculation processing by the calculator 13, since the frequency responses corresponding to the respective sections are calculated as described above, the synthesizer 14 connects the frequency responses corresponding to the respective sections such that the frequency ranges are continuous. FIGS. 7E and 7F illustrate a state in which the oscillation application signal and the response signal (FIG. 7E) corresponding to the section 3 and the frequency response corresponding to the section 3 calculated from the oscillation application signal and the response signal are synthesized with the frequency responses corresponding to the sections 1 and 2 illustrated in FIG. 7F. Note that the synthesizer 14 may synthesize the frequency responses corresponding to the respective sections by the calculator 13 each time the calculation is performed, or may synthesize the frequency responses together after calculating the frequency responses corresponding to all the sections.

A flow of measurement processing of the frequency response of the servo system by the measurement device 10 configured as described above will be described with reference to FIG. 8. First, in S101, predetermined oscillation is applied to the servo system by the oscillation executor 11, and as a result, a response signal of the servo system is obtained. Next, in S102, a frequency range is set. As for the setting of the frequency range, as described above, at least two frequency ranges are set, which are the frequency range including the resonance frequency of the servo system and not including the anti-resonance frequency (the frequency range of the section 2 illustrated in FIG. 6) and the frequency range including the anti-resonance frequency of the servo system (the frequency range of the section 1 illustrated in FIG. 6). Another frequency range such as the frequency range of the section 3 illustrated in FIG. 6 may be set.

Next, in S103, the identifier 12 identifies the oscillation application signal and the response signal corresponding to each section of the frequency range set in S102 from a result of the oscillation application of the servo system obtained in S101. Thereafter, in S104, the calculator 13 calculates the frequency responses corresponding to the sections of the respective frequency ranges, and in S105, synthesis processing of the frequency responses is performed (see FIG. 7).

Figure 9A:
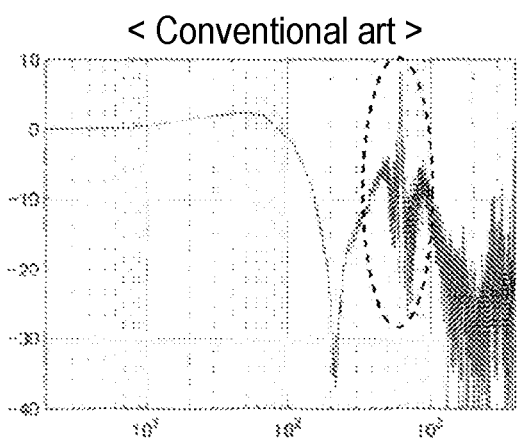
FIGS. 9A and 9B are diagrams illustrating a measurement result of the frequency response in the measurement device.
Figure 9B:
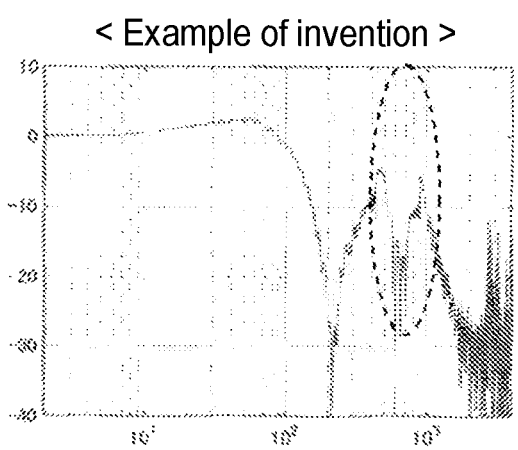

A measurement result (magnitude plot) obtained by the measurement processing illustrated in FIG. 8 is compared with a measurement result (magnitude plot) obtained by a conventional technique, and is illustrated in FIG. 9. The measurement result (FIG. 9A) according to the conventional art is the same as the magnitude plot illustrated in FIG. 4. In both results, a vicinity of the resonance frequency of the servo system is surrounded by a broken line and displayed. As illustrated in FIG. 9, in the measurement result of this example of the application, it can be seen that a peak of the gain in the vicinity of the resonance frequency is suppressed.

This means that the frequency response of the servo system can be accurately measured by excluding the influence of the excitation of the unnecessary resonance frequency due to the oscillation at the anti-resonance frequency. In accordance with the measurement result, a user can accurately determine the effect of the notch filter set in the servo system, and can achieve appropriate parameter adjustment.

<Modification of Measurement Processing>

Figure 10:
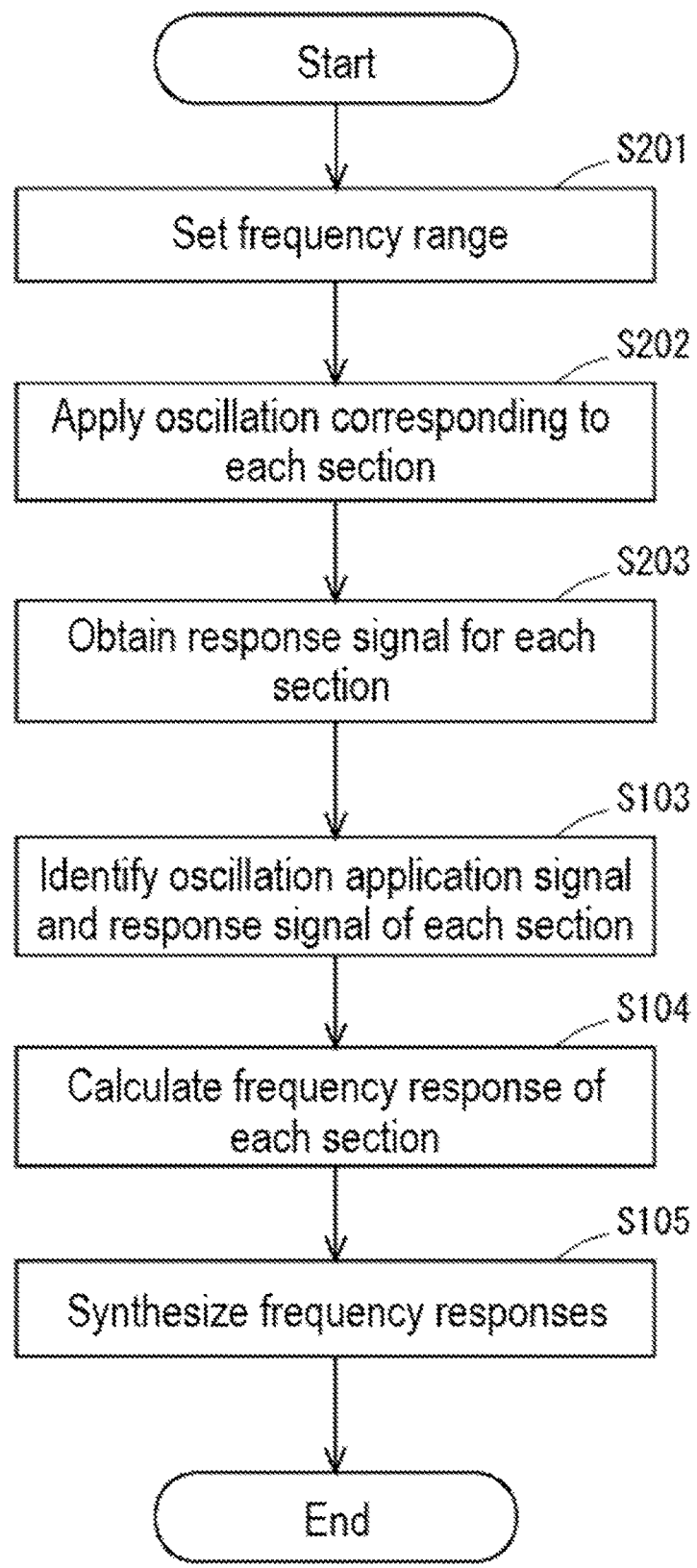
FIG. 10 is a second flowchart illustrating a flow of the measurement processing of the frequency response by the measurement device.

A flow of measurement processing according to a modification will be described with reference to FIG. 10. In this modification, since the predetermined oscillation by the oscillation executor 11 is applied separately for each frequency range, the frequency range is set first in S201. Note that the frequency range is in the same manner as illustrated in FIG. 6. In step S202, the oscillation executor 11 applies oscillation according to the section of the set frequency range. Specifically, oscillation corresponding to the section 1 (oscillation for changing the oscillation frequency to 435 Hz, which is oscillation corresponding to second oscillation of the application), oscillation corresponding to the section 2 (oscillation for changing the oscillation frequency from 435 Hz to 876 Hz, which is oscillation corresponding to first oscillation of the application), and oscillation corresponding to the section 3 (oscillation for changing the oscillation frequency from 876 Hz to an upper limit frequency) are applied individually. Then, as a result of the oscillation application, a servo system response signal corresponding to each section is obtained (processing of S203).

When the processing of S203 ends, the identifier 12 identifies a pair of the oscillation application signal and the response signal corresponding to each section in S103. In this modification, the oscillation application signal of the oscillation applied corresponding to each section in S202 and the response signal corresponding to each section obtained as a result in S203 are paired by the identifier 12. Thereafter, in S104, the calculator 13 calculates the frequency response corresponding to the section of each frequency range. In the calculation, the frequency response limited to the frequency range of the section to be calculated is calculated. Thus, for example, in calculation of the frequency response corresponding to the section 1 illustrated in FIG. 6, the frequency response in a range limited to 0 Hz to 435 Hz is calculated. Therefore, even if the response signal corresponding to the section 1 includes the excitation of the resonance frequency due to the oscillation applied at the anti-resonance frequency, the response frequency from which the influence of the excitation is excluded is calculated. Then, in S105, the synthesis processing of the frequency responses corresponding to the sections of the respective frequency ranges calculated in S104 is performed.

By the measurement processing according to such a modification, it is possible to accurately measure the frequency response of the servo system by excluding the influence of the excitation of the unnecessary resonance frequency due to the oscillation at the anti-resonance frequency, and thus, the user can accurately determine the effect of the notch filter set in the servo system and achieve appropriate parameter adjustment.

<Setting of Frequency Range (Section)>

As for the measurement processing disclosed in the application, in order to exclude the influence of the excitation of the unnecessary resonance frequency due to the oscillation at the anti-resonance frequency, in the setting of the frequency range, it is necessary to set the frequency range (section) for the measurement processing by distinguishing the frequency range (corresponding to the first range of the application) including the resonance frequency of the servo system and the frequency range (corresponding to the second range of the application) including the anti-resonance frequency of the servo system. Therefore, an aspect of setting the frequency range for the measurement processing will be exemplified below.

(1) First Mode

When a resonance frequency $\omega r$ of the servo system is known, an anti-resonance frequency $\omega a$ of the servo system can be estimated by the following Equation 1 on the basis of a ratio of an inertia moment of the load device 3 to an inertia moment of motor 2 (hereinafter, simply referred to as "inertia ratio").

[Math. 1]

$$\omega a = \frac{\omega r}{\sqrt{1+R}} \quad \text{(Equation 1)}$$

$$R = \frac{JL}{JM}$$

JL is the inertia moment of the load device 3, JM is the inertia moment of the motor 2, and R is the inertia ratio.

On the basis of the anti-resonance frequency $\omega a$ and the resonance frequency $\omega r$ estimated in this manner, it is possible to set a frequency range including the anti-resonance frequency $\omega a$ and a frequency range including the resonance frequency $\omega r$.

(2) Second Mode

In the servo system, when the notch filter is set in the current controller 43 as described above, it is desirable to accurately measure the frequency response in order to appropriately determine the effect of the notch filter. From this viewpoint, the frequency range for the measurement processing may be set on the basis of the center frequency and a Q factor as parameters for forming a function of the notch filter. In general, the center frequency of the notch filter is set to be the resonance frequency of the servo system, and the Q factor is expressed by the following Equation 2.

[Math. 2]

$$Q = \frac{\omega r}{\omega H - \omega L} \quad \text{(Equation 2)}$$

Here, $\omega H$ is a frequency at which oscillation energy becomes a half value on a high frequency side of a resonance peak, and $\omega L$ is a frequency at which the oscillation energy becomes a half value on a low frequency side of the resonance peak.

Then, a frequency (boundary frequency) fL as a boundary of a frequency range including the resonance frequency and the anti-resonance frequency can be expressed by the following Equation 3.

[Math. 3]

$$fL = -\frac{\omega r}{Q} + \sqrt{\left(\frac{\omega r}{Q}\right)^2 + 4\omega r^2} \quad \text{(Equation 3)}$$

As an example of the Q value, Q=5 can be adopted, but other numerical values may be adopted.

On the basis of the boundary frequency fL calculated in this manner, it is possible to set the frequency range including the anti-resonance frequency ωa and the frequency range including the resonance frequency ωr.

(3) Third Mode

Figure 11:
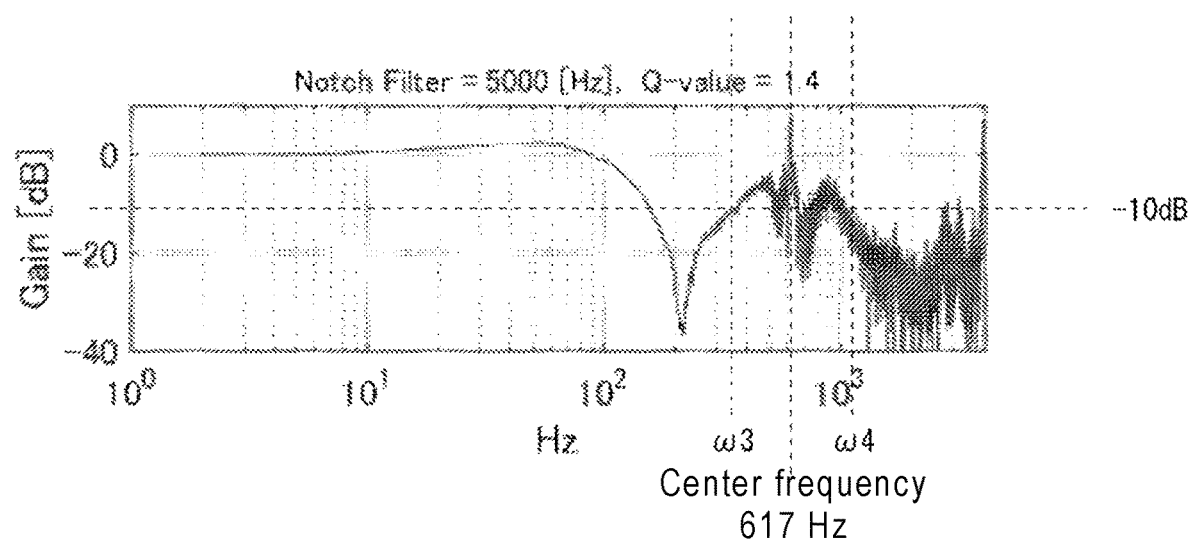
FIG. 11 is a diagram for describing setting of a frequency range in the measurement processing of the frequency response.

In a third mode, when the notch filter is set in the servo system, the boundary frequency as a boundary between adjacent frequency ranges is set on the basis of the center frequency of the notch filter and a gain in the frequency response. An aspect of the setting will be described with reference to FIG. 11. A magnitude plot illustrated in FIG. 11 is the same as the magnitude plot illustrated in FIG. 4. In the magnitude plot, a frequency on the low frequency side where the gain is lower than a predetermined gain threshold (for example, −10 dB) around the center frequency (that is, the resonance frequency ωr of the servo system) of the notch filter is defined as a boundary frequency ω3 on the low frequency side. Then, a boundary frequency ω4 on the high frequency side can be calculated by the following Equation 4.

[Math. 4]

$$\omega 4 = \frac{\omega r^2}{\omega 3} \quad \text{(Equation 4)}$$

The frequency range for the measurement processing can be set on the basis of the boundary frequencies ω3 and ω4 calculated in this manner. Specifically, on the basis of the boundary frequency ω3 on the low frequency side, it is possible to divide the frequency range on the low frequency side including the anti-resonance frequency ωa and the frequency range including the resonance frequency ωr. Furthermore, on the basis of the boundary frequency ω4 on the high frequency side, a frequency range on the high frequency side adjacent on the high frequency side to the frequency range including the resonance frequency ωr can be set. The frequency on the high frequency side does not include the anti-resonance frequency ωa and the resonance frequency ωr.

(4) Fourth Mode

In a fourth mode, when the notch filter is set in the servo system, the boundary frequency as a boundary between adjacent frequency ranges is set on the basis of the center frequency of the notch filter and a preset upper limit value (for example, 512 Hz) of a width of a frequency domain. This upper limit value is set in consideration that a noise level in the frequency response increases as the width of the frequency domain increases. For example, when the center frequency is 617 Hz, the noise level in the frequency response can be suppressed by setting the frequency domain on the basis of a boundary frequency shown in case 2 rather than in case 1 described below.

(Case 1)
Boundary frequency: 435 Hz, 876 Hz
(Case 2)
Boundary frequency: 435 Hz, 876 Hz, 1388 Hz, 1900 Hz, 2412 Hz, 2924 Hz, 3436 Hz (5) Fifth Mode When the resonance frequency ωr of the servo system is not known, the widths of the frequency ranges may be set to be the same. In this case, it is preferable to appropriately set the width of each frequency range such that the resonance frequency and the anti-resonance frequency of the servo system are included in different frequency ranges on the basis of a mechanical configuration of the load device 3 connected to the motor 2 in the servo system.

(6) Sixth Mode

When the resonance frequency ωr of the servo system is not known, in the calculation of the frequency response by the calculator 13, the width of the frequency range on the low frequency side is set to be larger than the width of the frequency range on the high frequency side such that data quantity of the frequency range on the low frequency side is larger than data quantity of the frequency range on the high frequency side. By setting such a frequency range, the noise level in the frequency response corresponding to the frequency range on the low frequency side can be suppressed to be low.

<Average Processing>

In the measurement processing disclosed in the application, since the calculator 13 calculates the frequency response corresponding to a part of the entire frequency range, the frequency response corresponding to the calculated part of the frequency range and the frequency response corresponding to another frequency range adjacent to the part of the frequency range are discontinuous due to the boundary value of the part of the frequency range, and accurate measurement of the frequency response of the servo system may be hindered. Therefore, in order to eliminate the discontinuity in the frequency response, the synthesizer 14 is configured to synthesize the frequency responses corresponding to the respective frequency ranges and then perform moving average processing on a result of the synthesis.

Figure 12A:
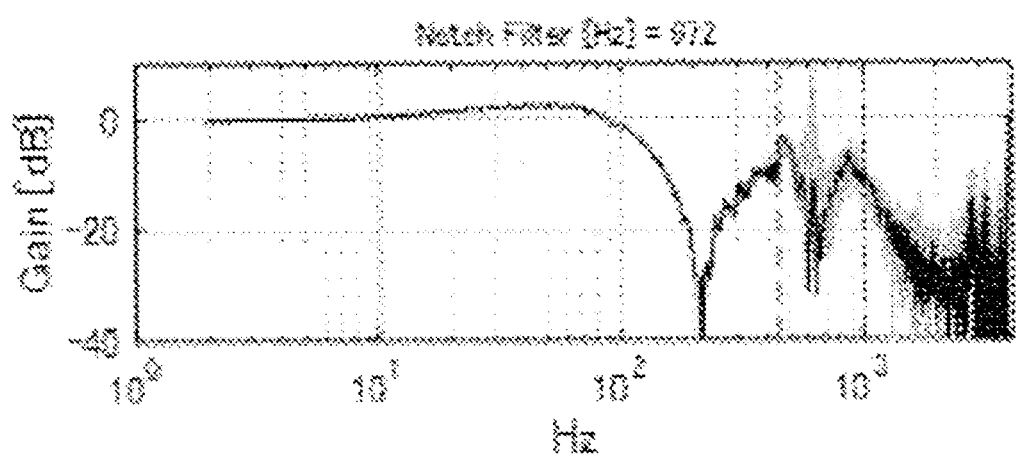
FIGS. 12A, 12B, 12C and 12D are diagrams for describing average processing in the measurement processing of the frequency response.
Figure 12B:
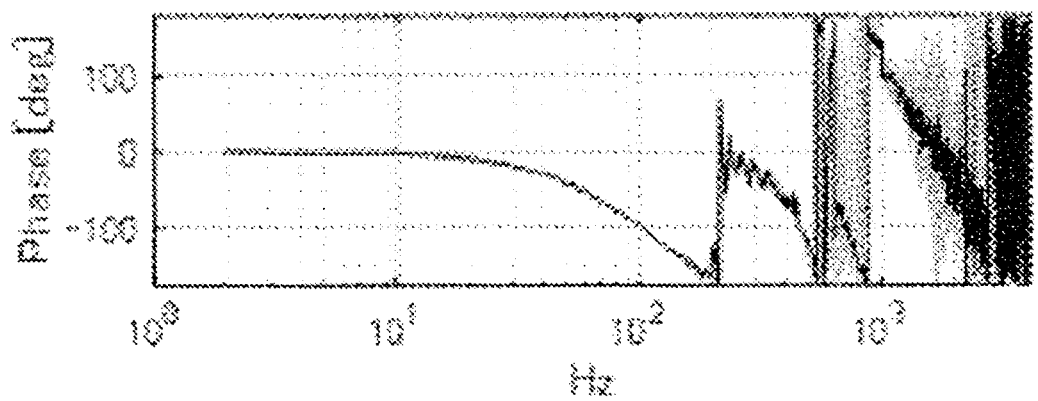
Figure 12C:
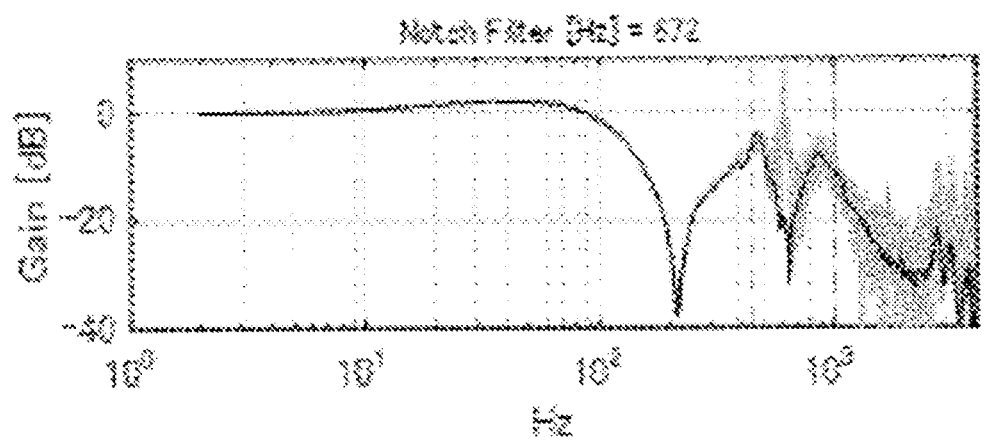
Figure 12D:
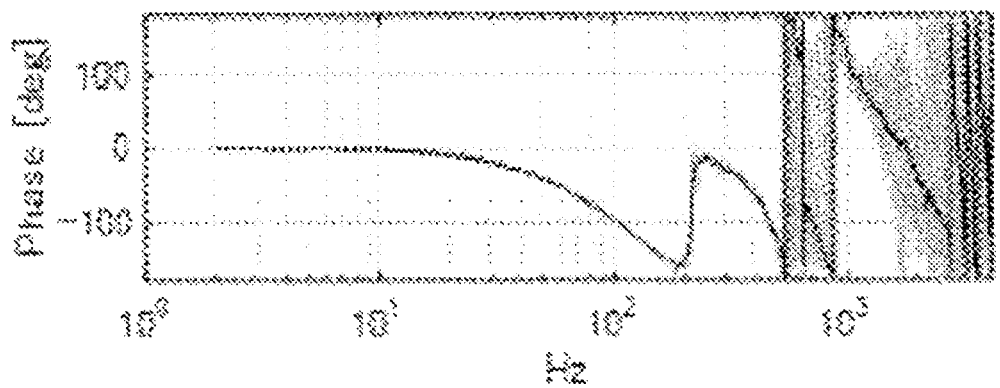

Here, a moving average point in the moving average processing may be set so as to increase toward the high frequency side. Since the noise level is higher on the high frequency side than on the low frequency side, continuity of the frequency response on the high frequency side can be maintained by performing such moving average processing. Here, FIG. 12A illustrates the frequency response in a case where the moving average processing is not performed (a result measured by the measurement processing disclosed in the application). FIG. 12B illustrates the frequency response in a case where the moving average processing is further performed on a result measured by the measurement processing disclosed in the application. In this case, the moving average point on the high frequency side is about three times as large as the moving average point on the low frequency side. As can be seen from FIG. 12, the continuity of the measured frequency response of the servo system is good in a case where the moving average processing is performed.

<Supplementary Note 1>

A measurement device (10) configured to measure a frequency response of a servo system includes an oscillation executor (11) configured to apply, to the servo system, predetermined oscillation in which an oscillation application time and an excitation frequency are associated with each other, an identifier (12) configured to identify, from a result of oscillation applied by the oscillation executor (11), a pair of a first oscillation application signal corresponding to a first range that is a frequency range including a resonance frequency of the servo system and not including an anti-resonance frequency of the servo system and a first response signal temporally corresponding to the first oscillation application signal, and further identify a pair of a second oscillation application signal corresponding to a second range that is a frequency range lower than the first range and includes the anti-resonance frequency and a second response signal temporally corresponding to the second oscillation application signal, a calculator (13) configured to calculate a first frequency response that is a frequency response corresponding to the first range based on the first oscillation application signal and the first response signal, and calculate a second frequency response that is a frequency response corresponding to the second range based on the second oscillation application signal and the second response signal, and a synthesizer (14) configured to synthesize frequency responses in frequency ranges corresponding to the first range and the second range based on the first frequency response and the second frequency response.

DESCRIPTION OF SYMBOLS

1: network
2: motor
3: load device
4: servo driver
5: PLC
11: oscillation executor
12: identifier
13: calculator
14: synthesizer

The invention claimed is:

1. A measurement device configured to measure a frequency response of a servo system, the measurement device comprising:
   an oscillation executor configured to apply, to the servo system, predetermined oscillation in which an oscillation application time and an excitation frequency are associated with each other;
   an identifier configured to identify, from a result of oscillation applied by the oscillation executor, a pair of a first oscillation application signal corresponding to a first range that is a frequency range including a resonance frequency of the servo system and not including an anti-resonance frequency of the servo system and a first response signal temporally corresponding to the first oscillation application signal, and further identify a pair of a second oscillation application signal corresponding to a second range that is a frequency range lower than the first range and includes the anti-resonance frequency and a second response signal temporally corresponding to the second oscillation application signal;
   a calculator configured to calculate a first frequency response that is a frequency response corresponding to the first range based on the first oscillation application signal and the first response signal, and calculate a second frequency response that is a frequency response corresponding to the second range based on the second oscillation application signal and the second response signal; and
   a synthesizer configured to synthesize frequency responses in frequency ranges corresponding to the first range and the second range based on the first frequency response and the second frequency response.

2. The measurement device according to claim 1, wherein the identifier further identifies a pair of a third oscillation application signal corresponding to a third range that is a remaining frequency range excluding the first range and the second range in the predetermined oscillation and a third response signal temporally corresponding to the third oscillation application signal from a result of oscillation applied by the oscillation executor,
   the calculator further calculates a third frequency response that is a frequency response corresponding to the third range based on the third oscillation application signal and the third response signal, and
   the synthesizer synthesizes frequency responses in an entire frequency range included in the predetermined oscillation based on the first frequency response, the second frequency response, and the third frequency response.

3. The measurement device according to claim 1, wherein the oscillation executor applies oscillation in a frequency range including the first range and the second range to the servo system as one of the predetermined oscillation,
   the identifier identifies an oscillation signal corresponding to the first range in the predetermined oscillation as the first oscillation application signal, and identifies a response signal corresponding to an oscillation application time of the first oscillation application signal in a response signal of the servo system as the first response signal, and
   the identifier further identifies an oscillation signal corresponding to the second range in the predetermined oscillation as the second oscillation application signal, and identifies a response signal corresponding to an oscillation application time of the second oscillation application signal in the response signal of the servo system as the second response signal.

4. The measurement device according to claim 1, wherein the oscillation executor applies oscillation in the first range to the servo system as a first oscillation that is one of the predetermined oscillation and applies oscillation in the second range to the servo system as a second oscillation that is another one of the predetermined oscillation,
   the identifier identifies an oscillation signal of the first oscillation as the first oscillation application signal and identifies a response signal of the servo system when the first oscillation is applied as the first response signal, and
   the identifier further identifies an oscillation signal of the second oscillation as the second oscillation application signal, and identifies a response signal of the servo system when the second oscillation is applied as the second response signal.

5. The measurement device according to claim 1, wherein the servo system is configured to perform servo control of a motor connected to a predetermined load, and
   the first range and the second range are set based on a ratio of an inertia moment of the predetermined load to an inertia moment of the motor.

6. The measurement device according to claim 1, wherein when filter processing by a notch filter is performed near the resonance frequency in the servo control by the servo system, the first range and the second range are set based on a center frequency and a Q value of the notch filter.

7. The measurement device according to claim 1, wherein when filter processing by a notch filter is performed near the resonance frequency in the servo control by the servo system, the first range and the second range are set based on a center frequency of the notch filter and a gain in a frequency response.

8. The measurement device according to claim 1, wherein when filter processing by a notch filter is performed near the resonance frequency in the servo control by the servo system, the first range and the second range are set based on a center frequency of the notch filter, and a width of the first range and a width of the second range are set to be smaller than a predetermined upper limit width.

9. The measurement device according to claim 1, wherein a width of the first range and a width of the second range are set to be identical.

10. The measurement device according to claim 1, wherein a width of the second range is set to be larger than a width of the first range.

11. The measurement device according to claim 1, wherein the synthesizer performs predetermined average processing on the frequency responses having been synthesized.

* * * * *